United States Patent
Vogt (10) Patent No.: US 7,294,553 B2
(45) Date of Patent: Nov. 13, 2007

(54) PLASMA-ENHANCED CHEMICAL VAPOUR DEPOSITION PROCESS FOR DEPOSITING SILICON NITRIDE OR SILICON OXYNITRIDE, PROCESS FOR PRODUCING ONE SUCH LAYER ARRANGEMENT, AND LAYER ARRANGEMENT

(75) Inventor: Mirko Vogt, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/515,611

(22) PCT Filed: May 14, 2003

(86) PCT No.: PCT/DE03/01552

§ 371 (c)(1),
(2), (4) Date: Nov. 7, 2005

(87) PCT Pub. No.: WO03/102264

PCT Pub. Date: Dec. 11, 2003

(65) Prior Publication Data

US 2006/0084236 A1    Apr. 20, 2006

(30) Foreign Application Priority Data

May 29, 2002    (DE) ................................ 102 23 954

(51) Int. Cl.
 *H01L 21/20*    (2006.01)
 *H01L 21/469*    (2006.01)
(52) U.S. Cl. ...................... 438/381; 438/758; 438/786; 438/769; 428/688; 428/704; 257/E21.647
(58) Field of Classification Search ................ 438/381, 438/758, 786, 769; 428/688, 704
See application file for complete search history.

(56) References Cited

U.S. PATENT DOCUMENTS 4,618,541 A    10/1986    Forouhi et al.

(Continued)

FOREIGN PATENT DOCUMENTS

EP    0 454 100 A2    10/1991

(Continued)

OTHER PUBLICATIONS

Bruce Odekirk and John Sheets, Plasma CVD Silicon Nitride On-Chip Capacitors For GaAs IC Fabrication, pp. 274-286, Proceedings of the Symposium on Dielectric Films on Compound Semiconductors, Las Vegas, NV, Oct. 14-17, 1985.*

(Continued)

*Primary Examiner*—Michael Lebentritt
*Assistant Examiner*—Mohsen Ahmadi
(74) *Attorney, Agent, or Firm*—Brinks Hofer Gilson & Lione (57) ABSTRACT

A plasma-enhanced chemical vapor deposition process for depositing relatively high dielectric constant silicon nitride or oxynitride to form an MIM capacitor is described. The flow rate ratios for the silicon nitride layer are: silane-to-ammonia between 1:20 and 6:5 and silane-to-nitrogen flow between 1:40 and 3:5. A pressure in the process chamber is between 260 Pa and 530 Pa. The flow rate ratios for the silicon oxynitride layer are: silane-to-dinitrogen monoxide between 1:2 and 25:4 and silane-to-nitrogen between 1:100 and 1:10. A larger, non-stoichiometric amount of silicon is incorporated in the layers as the flow rate of the silicon precursor is increased. The layers are deposited in substeps in which the deposition is interrupted between successive substeps. The layer is exposed to an oxygen-containing plasma such that electrically conductive regions of the layer are converted into electrically insulating regions as a result of interaction with the plasma.

21 Claims, 4 Drawing Sheets

U.S. PATENT DOCUMENTS

| | | | |
|---|---|---|---|
| 4,786,612 A * | 11/1988 | Yau et al. | 438/384 |
| 5,164,339 A | 11/1992 | Gimpelson | |
| 5,236,573 A * | 8/1993 | Shannon | 205/122 |
| 5,466,617 A | 11/1995 | Shannon | |
| 6,171,978 B1 | 1/2001 | Lin et al. | |
| 6,221,794 B1 * | 4/2001 | Pangrle et al. | 438/792 |
| 6,242,367 B1 * | 6/2001 | Sun et al. | 438/792 |
| 6,287,951 B1 | 9/2001 | Lucas et al. | |
| 6,309,932 B1 | 10/2001 | Ma et al. | |
| 6,316,820 B1 | 11/2001 | Schmitz et al. | |
| 6,324,439 B1 | 11/2001 | Cheung et al. | |
| 6,372,668 B2 * | 4/2002 | Sun et al. | 438/786 |
| 6,372,688 B1 | 4/2002 | Yamashita et al. | |
| 6,383,874 B1 | 5/2002 | Sun et al. | |
| 2001/0044220 A1 | 11/2001 | Sun et al. | |

FOREIGN PATENT DOCUMENTS

| | | | |
|---|---|---|---|
| GB | 2186116 | * | 11/1989 |
| GB | 2186116 B | * | 11/1989 |
| TW | 478158 | * | 3/2002 |

OTHER PUBLICATIONS

International Examination Report from corresponding International Application No. PCT/DE2003/001552, May 14, 2003.

International Search Report from corresponding International Application No. PCT/DE2003/001552, Dec. 2003.

Bruce Odekirk and John Sheets, *Plasma CVD Silicon Nitride On-Chip Capacitors For GaSs IC Fabrication,* pp. 274-286, Proceedings of the Symposium on Dielectric Films on Compound Semiconductors, Las Vegas, NV, Oct. 14-17, 1985.

English Translation of Taiwanese Office Action for Taiwanese Patent Application No. 92113777.

* cited by examiner

PLASMA-ENHANCED CHEMICAL VAPOUR DEPOSITION PROCESS FOR DEPOSITING SILICON NITRIDE OR SILICON OXYNITRIDE, PROCESS FOR PRODUCING ONE SUCH LAYER ARRANGEMENT, AND LAYER ARRANGEMENT

This application is the national stage application of international application number PCT/DE03/01552, filed on May 14, 2003, which claims the benefit of priority to German Patent Application DE 102 23 954.1, filed on May 29, 2002, both of which are incorporated herein by reference.

The invention relates to a plasma-enhanced chemical vapour deposition (PECVD) process for depositing silicon nitride, to a plasma-enhanced chemical vapour deposition process for depositing silicon oxynitride, to a process for fabricating a layer arrangement and to a layer arrangement.

Metal-insulator-metal capacitors (MIM capacitors) are generally composed of a first metallic layer on a substrate, a dielectric layer arranged on the first metallic layer and a second metallic layer arranged on the dielectric layer. The three layers of an MIM capacitor are applied to the substrate surface using semiconductor technology processes.

An MIM capacitor is of interest for a number of technical applications. For example, an MIM capacitor can be used in a radiofrequency circuit (RF circuit), in an analogue integrated circuit or in a high-performance microprocessor (MPUs). Furthermore, an application of an MIM capacitor which is of economic interest involves the possibility of this capacitor being used as a storage capacitor in a DRAM (dynamic random access memory). Furthermore, it is possible to use an MIM capacitor in a liquid crystal display (LCD). An MIM capacitor is also in widespread use in a logic circuit.

An important requirement of an MIM capacitor is that its capacitance C be sufficiently high. The capacitance of a plate-type capacitor can be calculated using the following equation $$C = \epsilon A/d \tag{1}$$

where $\epsilon$ is the relative dielectric constant of the medium introduced between the capacitor plates, A is the area of a plate of the plate-type capacitor and d is the distance between the two plates of the capacitor.

To achieve a sufficiently high capacitance, the area of the capacitor A can be accordingly selected to be sufficiently large. However, an important objective in silicon microelectronics is to develop ever smaller structures. Therefore, the need to achieve a sufficiently high capacitance in an MIM capacitor by increasing the plate area of the capacitor is incompatible with the objective of further miniaturization of integrated circuits. Furthermore, as equation (1) demonstrates, the distance between the two plates, i.e. the thickness d of the dielectric layer between the two metallic layers of the MIM capacitor, can be selected to be sufficiently small. As soon as the layer thickness of an MIM capacitor drops below a dimension of approximately 50 nm, problems occur with regard to its electrical stability; for example, electrical breakdowns may occur and electrical leakage currents may increase.

Therefore, it is desirable for the dielectric constant of the dielectric layer between the two metallic layers of an MIM capacitor to be as high as possible.

According to the prior art, the material used for the dielectric layer of an MIM capacitor is often stoichiometric silicon nitride ($Si_3N_4$) or stoichiometric silicon oxide, i.e. silicon dioxide ($SiO_2$).

Silicon nitride has the property of a sufficiently high dielectric constant ($\epsilon = 6-7$). However, silicon nitride layers used as dielectric layers of an MIM capacitor have the drawback that the electrical breakdown field strength is relatively low (approximately 2 MV/cm). By contrast, the breakdown field strength of silicon dioxide is advantageously significantly greater than that of silicon nitride (approximately 6 MV/cm), but the relative dielectric constant of silicon dioxide ($\epsilon = 4$) is significantly lower than that of silicon nitride.

According to the prior art, a dielectric layer of an MIM capacitor is formed, for example, by thermal growth or using the CVD (chemical vapour deposition) process.

The CVD process is a coating technology used to deposit thin films from the vapour phase on a solid substrate. The principle of the CVD process consists in passing starting materials in vapour form, known as precursors, over a substrate and chemically breaking them down into their constituents, with the result that a new layer grows on the surface of the substrate. The precursors are generally broken down by thermal means, i.e. by the substrate being heated. The actual deposition involves a chemical reaction, for example a volatile gaseous component reacts with another gas to form a solid material which is deposited on the substrate. However, the CVD process has the drawback that the process temperatures are relatively high.

Plasma-enhanced chemical vapour deposition (PECVD) offers one way out of having to use high process temperatures. While in conventional CVD processes the vapour phase reaction is initiated by thermal energy resulting from the substrate being heated, the PECVD process is based on converting a gas into the plasma state in the vicinity of the substrate surface. One of the reaction products is a solid which is deposited on the surface, with the result that a new layer is formed. The PECVD process can be used, inter alia, to deposit silicon nitride ($SiN_x$), silicon oxide ($SiO_x$) and silicon oxynitride ($SiO_yN_z$). A plasma is ignited in a PECVD reactor between the substrate holder, which serves as an electrode, and a further electrode, by means of a strong alternating electrical field. The energy of the field breaks open bonds between the gas molecules which have been introduced into the PECVD reactor so that the gas molecules are decomposed. By means of an optional second electric field, the free radicals which are formed can be moved towards the substrate, where the highly reactive free radicals are deposited and form the desired layer.

The prior art has disclosed processes in which dielectric layers comprising silicon oxide, silicon nitride or silicon oxynitride are produced using the PECVD process. However, layers of this type often do not have a sufficiently high relative dielectric constant. Furthermore, the dielectric layers produced by means of the PECVD process which are known from the prior art are often not sufficiently mechanically or electrically stable. According to the process which is known from the prior art, MIM capacitors with sufficiently high capacitances can therefore only be produced if the distance between the metallic layers of an MIM capacitor is selected to be sufficiently short. In this case, however, undesirable electrical breakdowns between the two metallic layers can easily occur.

[1] discloses a layer arrangement for the fabrication of an insulation structure.

[2] discloses a process for producing a silicon nitride film which transmits UV radiation.

[3] discloses a silicon nitride layer which can be produced by means of PECVD as a passivation layer.

[4] discloses a process for producing silicon oxynitride films.

[5] discloses a process for producing a silicon nitride film as a gate dielectric.

[6] discloses the fabrication of electronic devices which include MIMs and TFTs.

[7] discloses the production of silicon oxynitride as a covering layer of a microstructure.

[8] discloses a process for producing a combination of hard mask and antireflection layer.

[9] discloses a process and device for applying films using reduced deposition rates.

[10] discloses a process for forming silicon-based thin films.

The invention is based on the problem of providing a dielectric layer which has a relatively high relative dielectric constant yet at the same time retains substantially the same mechanical and electrical stability.

The problem is solved by a plasma-enhanced chemical vapour deposition process for depositing silicon nitride, by a plasma-enhanced chemical vapour deposition process for depositing silicon oxynitride, by a process for fabricating a layer arrangement, and by a layer arrangement having the features described in the independent patent claims.

In the plasma-enhanced chemical vapour deposition process according to the invention for depositing silicon nitride on a substrate, silane, ammonia and nitrogen are used as precursors, the silane to ammonia flow rate ratio is set to between 1:20 and 6:5 and the silane to nitrogen flow rate ratio is set to between 1:40 and 3:5.

In the plasma-enhanced chemical vapour deposition process for depositing silicon oxynitride on a substrate, silane, dinitrogen monoxide and nitrogen are used as precursors. The silane to dinitrogen monoxide flow rate ratio is set to between 1:2 and 25:4, and the silane to nitrogen flow rate ratio is set to between 1:100 and 1:10.

The flow rates mentioned, given in standard cubic centimetres per minute (sccm), are mass flow rates. Furthermore, the invention provides a process for fabricating a layer arrangement in which a first electrically conductive layer is formed on a substrate, in which a silicon nitride layer is formed on the first electrically conductive layer using the plasma-enhanced chemical vapour deposition process for depositing silicon nitride having the features described above or a silcon oxynitride layer is formed on the first electrically conductive layer using the plasma-enhanced chemical vapour deposition process for depositing silicon oxynitride having the features described above. Furthermore, a second electrically conductive layer is formed on the silicon nitride layer or on the silicon oxynitride layer.

Furthermore, the invention provides a layer arrangement which has been fabricated using the process having the features described above.

The flow rate ratios for the precursors of the PECVD process for producing a silicon nitride layer or a silicon oxynitride layer which have been selected in accordance with the invention clearly differ from the prior art in that in the case of the deposition of silicon nitride the silane ($SiH_4$) to ammonia ($NH_3$) flow rate ratio or in the case of the deposition of silicon oxynitride the silane to dinitrogen monoxide ($N_2O$) flow rate ratio have been increased. The layers of silicon nitride ($SiN_x$) or silicon oxynitride ($SiO_yN_z$) which have been produced in accordance with the invention in this case preferably have non-stoichiometric silicon contents, i.e., by way of example, the silicon nitride layers which have been produced in accordance with the invention may have a higher silicon content than stoichiometric silicon nitride ($Si_3N_4$) which includes 3/7 atom parts of silicon. Since silicon has a high dielectric constant ($\epsilon=12$), therefore, the dielectric constant of the silicon nitride or silicon oxynitride layers produced in accordance with the invention is also increased.

Since the invention provides a process which makes it possible to deposit a dielectric layer of silicon nitride or of silicon oxynitride with a dielectric constant which is increased compared to the prior art, a layer of this type is suitable for use as a dielectric layer of an MIM capacitor. Referring back to equation (1), a capacitor of the same capacitance C can be produced within a smaller area of the two metallic covering layers of the MIM capacitor when a layer of this type is used. On the other hand, when the silicon nitride or silicon oxynitride layer which has been produced in accordance with the invention is used as a dielectric layer of an MIM capacitor, it is possible to select a greater thickness for the dielectric layer and therefore a greater distance d between the two metallic covering layers while achieving the same capacitance, so that a higher mechanical and electrical stability are achieved in the MIM capacitor. In particular in the case of higher dielectric layer thickness in an MIM capacitor, problems with electrical leakage currents between the metallic layers are avoided and electrical breakdowns under high electric fields are likewise avoided.

Furthermore, experiments carried out on the silicon nitride or silicon oxynitride layers which have been produced in accordance with the invention demonstrate that these layers with a high silicon content have reduced compressive stresses (i.e. internal mechanical stresses) and a reduced wet-etching rate. A sufficiently low wet-etching rate is advantageous, since this allows a layer of this type to be removed or etched back under controlled process conditions.

Furthermore, the process according to the invention is based on the standard semiconductor technology process PECVD, as can be carried out using commercially available PECVD reactors, for example the "Novellus Concept One". Therefore, it is possible to produce the silicon-rich silicon nitride or silicon oxynitride layers according to the invention at a moderate level of outlay.

Preferred refinements will emerge from the dependent claims.

In the plasma-enhanced chemical vapour deposition process for depositing silicon nitride which has been characterized above, it is preferable for the pressure in the process chamber to be set to between approximately 260 Pa and 530 Pa.

The generation of the plasma from the precursors silane, ammonia and nitrogen which are introduced into the process space is preferably effected by means of a high-frequency field with a power of between approximately 300 W and 700 W.

A low-frequency field with a power of between approximately 300 W and 700 W may optionally be applied to the substrate in order to accumulate plasma in an area surrounding the substrate.

According to a preferred refinement, the flow rate of silane is set to between 100 standard cubic centimetres per minute and 600 standard cubic centimetres per minute.

In the process, it is preferable for the silane to ammonia flow rate ratio to be set to between 1:10 and 3:5, for the silane to nitrogen flow rate ratio to be set to between 1:20 and 3:20, for the pressure in the process chamber to be set to between 360 Pa and 430 Pa, and for the power of the high-frequency field and the power of the low-frequency field each, independently of one another, to be set to between approximately 400 W and 600 W.

Very good results are achieved if, in the process, the silane to ammonia flow rate ratio is set to approximately 3:10, the silane to nitrogen flow rate ratio is set to approximately 3:16, the pressure in the process chamber is set to approximately 350 Pa and the high-frequency power and the low-frequency power are each set to approximately 500 W.

According to this refinement, the flow rate of silane can be set to approximately 300 standard cubic centimetres per minute.

With regard to the plasma-enhanced chemical vapour deposition process for depositing silicon oxynitride on a substrate, the pressure in the process chamber is preferably set to between 260 Pa and 530 Pa.

Furthermore, a high-frequency field with a power of between 200 W and 500 W can be applied in order to generate the plasma.

Furthermore, a low-frequency field with a power of up to 300 W can be applied in order to accumulate plasma in an area surrounding the substrate. However, the low-frequency field is not necessarily required and can optionally be omitted.

The flow rate of silane is preferably set to between 100 and 500 standard cubic centimetres per minute.

According to a favourable configuration of the process according to the invention for depositing silicon oxynitride on a substrate, the silane to dinitrogen monoxide flow rate ratio is set to between 1:1 and 25:8, the silane to nitrogen flow rate ratio is set to between 1:50 and 1:20, the pressure in the process chamber is set to between 350 Pa and 430 Pa and the power of the high-frequency field is set to between 300 W and 400 W, and the power of the low-frequency field is set to up to 150 W. However, the low-frequency field may also be omitted.

Particularly favourable results are obtained if, in the process according to the invention for depositing a silicon oxynitride layer, the silane to dinitrogen monoxide flow rate ratio is set to approximately 13:12, the silane to nitrogen flow rate ratio is set to approximately 13:800, the pressure in the process chamber is set to approximately 350 Pa and the power of the high-frequency field is set to approximately 300 W.

In this case, it is preferable for the flow rate of silane to be set to approximately 130 standard cubic centimetres per minute.

The substrate used is preferably a semiconductor substrate, for example a silicon substrate, such as a silicon wafer or a silicon chip.

With regard to the above-described process for fabricating a layer arrangement having the features described above, a metal is used for the first and/or second electrically conductive material.

The layer arrangement which is fabricated in accordance with the process is preferably used as an MIM capacitor.

While an electrically insulating layer is being formed, for example using the process according to the invention, there may be a risk of the electrically insulating property of a layer which is formed, for example of a silicon oxide or silicon oxynitride layer, not being achieved in an ideal way on account of fluctuations in the procedure and/or on account of other undesirable effects. A layer of this type may have a certain residual electrical conductivity, which is undesirable. To avoid this, the invention provides the processes described below, which make it possible to improve the electrically insulating property of a layer, for example of a silicon oxide or silicon oxynitride layer which has been produced in accordance with the invention.

According to a first process for improving the electrically insulating property of an electrically insulating layer which is to be deposited, for example of a silicon oxynitride or silicon oxide layer, the deposition process is interrupted at least once and then continued after a predeterminable waiting time, so that the electrically insulating layer is formed from n+1 part-layers, n being the number of interruptions. Based on the above-described plasma-enhanced chemical vapour deposition process according to the invention for depositing silicon oxynitride or silicon oxide on a substrate, the plasma-enhanced deposition process is interrupted one or more times and in each case continued after a waiting time. As a result of the plasma being switched off briefly or of the deposition process being interrupted, therefore, it is possible to interrupt the gradual formation of the layer. This obviously results in a layer stack comprising a plurality of part-layers (which, however, are made from substantially the same material), the interruption to the process meaning that defects, i.e. solid-state disorders (e.g. dislocations), may advantageously occur frequently at the interfaces between two adjacent part-layers. These solid-state defects obviously interrupt any continuous electrically conductive regions which may be present in the layer and therefore suppress parasitic current paths. A heterogeneous electrically insulating layer obtained in this way has an improved insulating action compared to a layer which is deposited without interruption to the deposition process. Electrical breakdowns and leakage currents are therefore avoided.

To summarize, the invention provides a process for depositing an approximately electrically insulating layer with a reduced residual conductivity, preferably a silicon oxide or silicon oxynitride layer, according to which process the layer is deposited in at least two substeps using a predetermined deposition process, preferably a plasma-enhanced deposition process, the deposition is interrupted for in each case a predeterminable time between two successive substeps.

According to a second process, which can be used as an alternative or in addition to the process described above, the electrical insulation properties of an approximately electrically insulating layer which is to be produced in accordance with the invention, for example of a silicon oxide or silicon oxynitride layer, is improved by the fact that any electrically conductive regions which may be present in a layer which has been deposited, for example unsaturated silicon bonds in a silicon oxide layer, are oxidized and therefore saturated in an oxygen-containing plasma. In other words, by way of example, following deposition of some or all of a silicon oxide or silicon oxynitride layer, a surface treatment can be carried out in an oxygen-containing plasma (for example an oxygen plasma and/or a dinitrogen monoxide plasma). Previously unsaturated silicon bonds located at the surface of a complete layer or part-layer are thereby oxidized, with the result that the residual conductivity of the layer formed is reduced and any conductive paths for leakage currents are eliminated or at least interrupted.

To summarize, the invention provides a process for depositing an approximately electrically insulating layer with a reduced residual conductivity, preferably a silicon oxide or silicon oxynitride layer, according to which process the layer is deposited using a predetermined deposition process, preferably a plasma-enhanced deposition process, the layer is exposed to an oxygen-containing plasma in such a manner that electrically conductive regions of the layer are converted into electrically insulating regions as a result of an interaction with the oxygen-containing plasma.

Exemplary embodiments of the invention are illustrated in the figures and are explained in more detail below.

Figure 1:
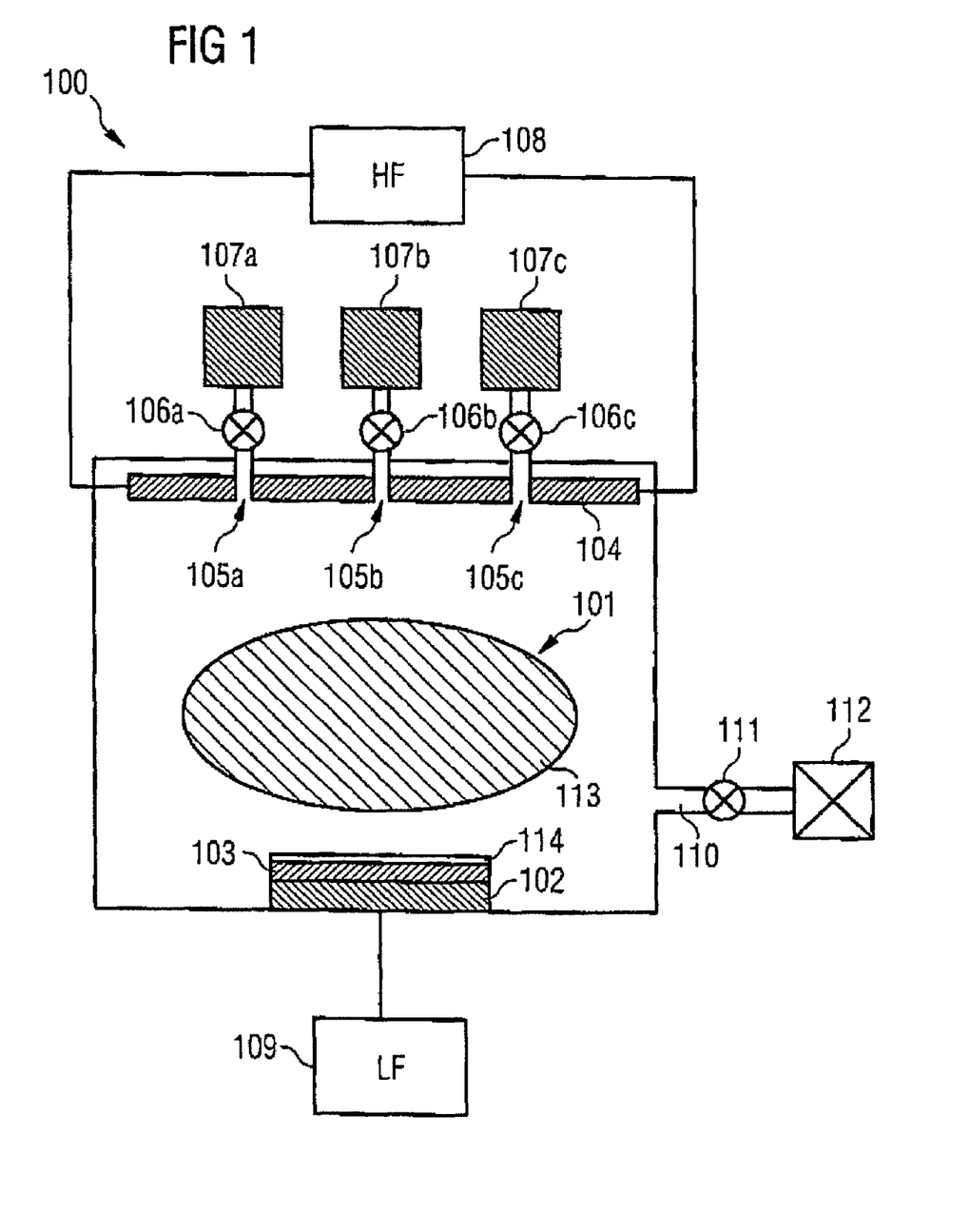
FIG. 1 shows a PECVD reactor by means of which the process for depositing a silicon nitride layer or a silicon oxynitride layer in accordance with a preferred exemplary embodiment of the invention can be carried out.

The text which follows describes a preferred exemplary embodiment of the plasma-enhanced chemical vapour deposition process according to the invention for depositing silicon nitride on a substrate on the basis of the PECVD reactor 100 shown in FIG. 1.

The PECVD reactor 100 shown in FIG. 1 has a process chamber 101. A silicon wafer 103 is mounted on a holding device 102 in the process chamber 101. Furthermore, an electrode 104 which has been divided into a plurality of sections and has three openings 105a, 105b, 105c is also arranged in the process chamber 101. If a first valve 106a is open, silane gas ($SiH_4$) from the first reservoir 107a can be introduced into the process chamber 101 through the first opening 105a. Furthermore, if a second valve 106b is open, ammonia gas ($NH_3$) can be introduced into the process chamber 101 through the second opening 105b.

Furthermore, if a third valve 106c is open, nitrogen gas ($N_2$) from the third reservoir 107c can be introduced into the process chamber 101 through a third opening 105c. The electrode 104 is coupled to an HF voltage source 108 for generating a high-frequency electric field in the process chamber. Furthermore, according to the exemplary embodiment shown, the holding device 102 is coupled to an LF voltage source 109 for generating a low-frequency voltage signal and for applying it to the holding device 102 and to the wafer 103. Furthermore, the PECVD reactor 100 has a gas outlet 110, from which gas, if the fourth valve 111 is open, can be removed from the process chamber 101. Furthermore, FIG. 1 shows a pump 112, by means of which reaction products which are not required are pumped out of the process chamber 101 through the gas outlet 110 and by means of which a desired pressure is set in the process chamber 101.

When the PECVD reactor 100 is operating, a high-frequency voltage is applied to the electrode 104 by means of the HF voltage source 108 such that a strong alternating electric field is formed in the process chamber 101 by means of the electrode 104. Silane is admitted to the process chamber 101 from the first reservoir 107a at a suitable flow rate, which can be set, for example, by adjusting the first valve 106a. Furthermore, ammonia gas is introduced into the process chamber 101 from the second reservoir 107 at a suitable flow rate, it being possible to set the flow rate, for example, by means of the second valve 106b. Nitrogen gas is admitted to the process chamber 101 from the third reservoir 107c at a suitable flow rate, which is set by adjusting the third valve 106c. The gas molecules which have been admitted are brought into the plasma state by means of the high-frequency electric field. In other words, the gas molecules are converted into free radicals, for example chemically highly reactive silicon free radicals are generated from silane. As a result, a plasma 113 is formed. At the same time as the high-frequency electric field which is generated by means of the HF voltage source 108, a low-frequency electric voltage is applied to the wafer 103 via the holding device 102 by means of the LF voltage source 109. This low-frequency voltage ensures that the wafer 103 is negatively biased with respect to the positively charged plasma 113. As a result of electrical forces, the free radicals of the plasma 113 diffuse to the surface of the silicon wafer 103, where they are adsorbed. On the hot surface of the silicon wafer 104, the free radicals react chemically so as to form a silicon nitride layer 114 on the surface of the wafer 103. The reaction equation for this chemical reaction on the surface of the silicon wafer 103 takes the following form:

$$SiH_4 + NH_3 + N_2 \rightarrow SiN_x + \qquad (2)$$

According to this exemplary embodiment, the precursors used are silane, ammonia and nitrogen. According to the exemplary embodiment described, the silane flow rate set is 300 standard cubic centimetres per minute, the ammonia flow rate set is 1000 standard cubic centimetres per minute, the nitrogen flow rate set is 1600 standard cubic centimetres per minute, the pressure in the process chamber is set to approximately 350 Pa and the high-frequency power of the HF voltage source 108 (HF=high frequency) and the low-frequency power of the LF voltage source 109 (LF=low frequency) are in each case set to 500 W. The pressure can be set by adjusting the valve 111 and the working parameters of the pump 112. According to the exemplary embodiment described, therefore, the silane to ammonia flow rate ratio is set to approximately 3:10, whereas the silane to nitrogen flow rate ratio is set to approximately 3:16. It should be emphasized that the LF voltage source 109 is optional and merely fulfils the function of causing the positively charged plasma to accumulate in an area surrounding the surface of the silicon wafer 103, so that a chemical reaction on the surface of the silicon wafer 103 is promoted. However, the LF voltage source 109 can also be omitted. According to the exemplary embodiment described, the frequency selected for the HF voltage source is 13.56 MHz, whereas the frequency selected for the LF voltage source is 100 kHz according to the exemplary embodiment described. According to the exemplary embodiment described, the "Novellus Concept One" system produced by Novellus™ is selected as the PECVD reactor 100.

It should be emphasized that, as an alternative to the PECVD reactor shown in FIG. 1, it is also possible to use any other suitable PECVD reactor to carry out the process according to the invention.

The PECVD reactor 100 can also be used to carry out the plasma-enhanced chemical vapour deposition process according to the invention to deposit silicon oxynitride on a substrate. To do this, before the process according to the invention is carried out, silane gas is introduced into the first reservoir 107a, dinitrogen monoxide ($N_2O$) is introduced into the second reservoir 107b and nitrogen ($N_2$) is introduced into the third reservoir 107c. In this case, the generation of a silicon oxynitride layer on the surface of the silicon wafer 103 takes place according to the following reaction equation:

$$SiH_4 + N_2O + N_2 \rightarrow SiO_xN_z + \quad (3)$$

According to the exemplary embodiment described, the silane flow rate is set to 130 sccm, the dinitrogen monoxide flow rate is set to 120 sccm, the nitrogen flow rate is set to 8000 sccm, the pressure in the process chamber 101 is set to approximately 350 Pa, the high-frequency power of the HF voltage source 108 is set to approximately 300 W, and the LF voltage source 109 is switched off, i.e. is not used.

Clearly, one basic idea of the invention can be considered to reside in the provision of a silicon nitride layer or a silicon oxynitride layer in which the silicon content is increased by using the PECVD process and by using a suitable procedure, with the result that, on account of the high relative dielectric constant of silicon, the relative dielectric constant of the silicon nitride or silicon oxynitride layer which is formed is increased. Varying the process gases (silane, nitrogen and ammonia or dinitrogen monoxide) allows stoichiometrically accurate adjustment of the silicon content of the silicon nitride or silicon oxynitride layers which are formed.

A basic idea of the invention can also be considered to reside in the fact that, during the production of a silicon nitride layer using the PECVD process, according to the invention the flow rate of ammonia is reduced, or that, to produce a silicon oxynitride layer, the flow rate of dinitrogen monoxide is reduced, so that a desired, predeterminable stoichiometry with an increased silicon content is obtained in the silicon nitride or silicon oxynitride layers which result.

The text which follows explains experimental tests carried out on the silicon nitride or silicon oxynitride layers produced in accordance with the invention, demonstrating the advantageous properties of the process according to the invention. Furthermore, the physico-chemical relationships between the choice of process parameters for the PECVD process and the layers which are formed are explained.

Figure 2:
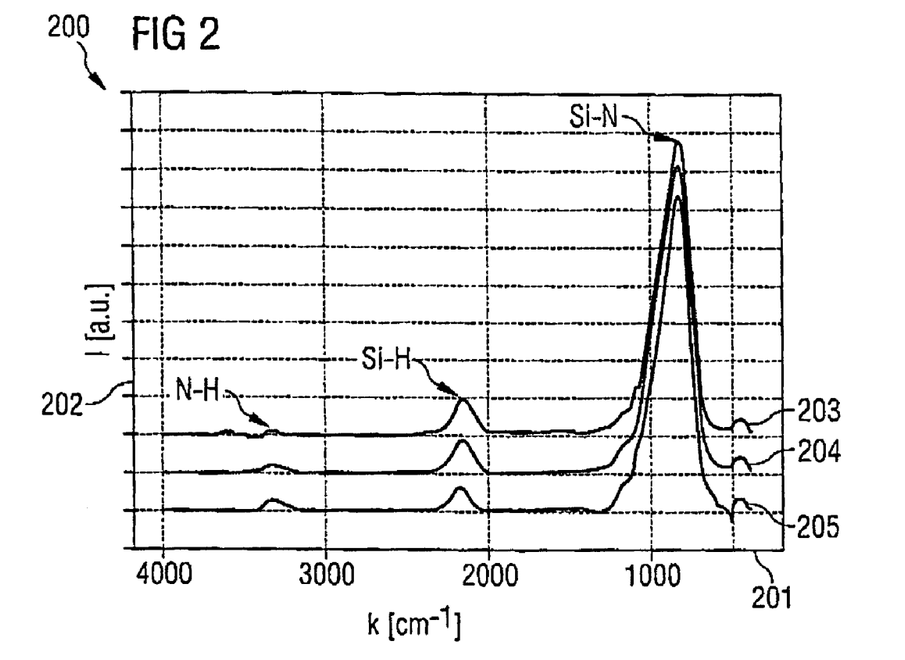
FIG. 2 shows a diagram which has been determined using an infrared spectroscopy method (FTIR) and which diagrammatically depicts the way in which the infrared absorption I is dependent on the wave number k of the infrared radiation for silicon nitride layers which have been produced in accordance with the invention for different ammonia flow rates.

FIG. 2 shows a diagram 200 which shows a FTIR (Fourier transform infrared spectroscopy) spectrum of silicon nitride layers produced in accordance with the invention.

The wave number k (in $cm^{-1}$) of the infrared radiation radiated onto the silicon nitride layer produced in accordance with the invention is plotted on the abscissa 201. The intensity of the absorbed infrared radiation (in arbitrary units) is plotted on the ordinate 202 of the diagram 200. Each peak in an FTIR spectrum is assigned a characteristic material or a characteristic chemical bond. In the diagram 200, the three curves 203, 204, 205 shown have peaks which are characteristic of N—H bonds, Si—H bonds and Si—N bonds. Therefore, the intensity of the corresponding peaks is a measure of the stoichiometric level of the corresponding element or of the corresponding chemical bond in the silicon nitride layer being tested.

A first curve 203 shows an FTIR spectrum as obtained when the plasma-enhanced chemical vapour deposition process according to the invention for depositing silicon nitride is carried out using an ammonia flow rate of 1500 standard cubic centimetres per minute. A second curve 204 corresponds to an ammonia flow rate of 2000 standard cubic centimetres per minute, and a third curve 205 shows the FTIR spectrum for an ammonia flow rate of 4000 standard cubic centimetres per minute. It can be seen from the peak which is characterized by the label "Si—H" in the diagram 200 that the level of silicon-hydrogen bonds in the silicon nitride layer obtained increases the lower the ammonia flow rate is selected to be. In other words, reducing the ammonia flow rate leads to an increase in the silicon content in the silicon nitride layer which results. Therefore, by reducing the ammonia flow rate when carrying out the PECVD process, it is possible to increase the silicon content in the silicon nitride layer which results and in this way to increase the relative dielectric constant of the layer which is formed.

Figure 3:
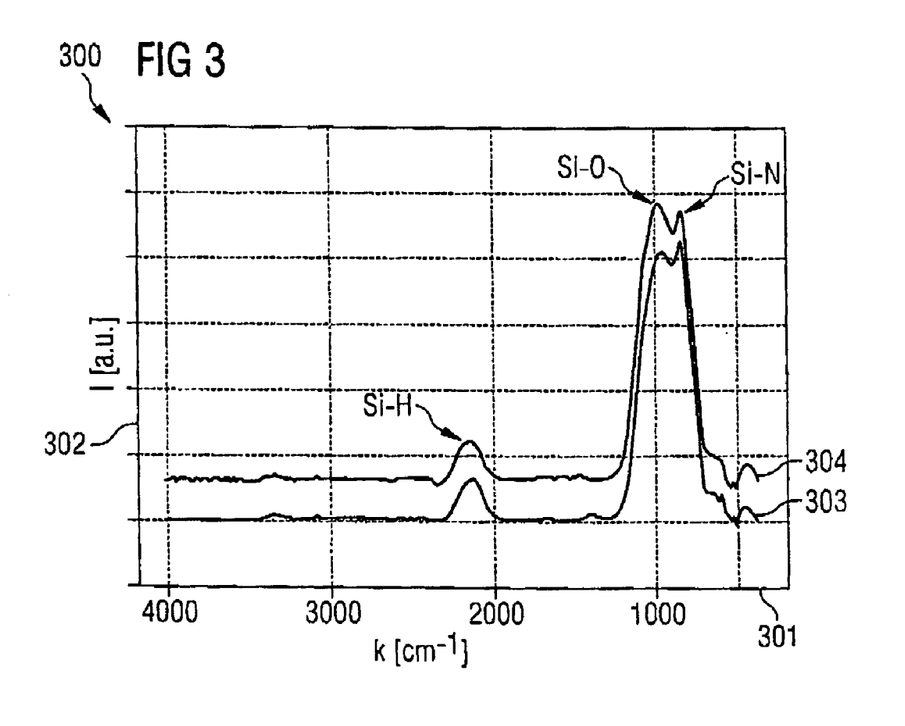
FIG. 3 shows a diagram which has been determined using an infrared spectroscopy method (FTIR) and which diagrammatically depicts the way in which the infrared absorption I is dependent on the wave number k of the infrared radiation for silicon oxynitride layers which have been produced in accordance with the invention for different dinitrogen monoxide flow rates.

FIG. 3 shows a diagram 300 which shows the FTIR spectrum of silicon oxynitride layers which have been produced in accordance with the invention. Once again, the wave number k (in $cm^{-1}$) of the infrared radiation radiated in is plotted on the abscissa 301. The infrared absorption I (in arbitrary units) is plotted on the ordinate 302. The diagram 300 shows a first curve 303 and a second curve 304. The first curve 303 shows the FTIR spectrum obtained for a silicon oxynitride layer produced in accordance with the invention when the dinitrogen monoxide flow rate is set to 160 standard cubic centimetres per minute. By contrast, for the second curve 304 the flow rate of dinitrogen monoxide was set to 200 standard cubic centimetres per minute. As can be seen from the two partially overlapping resonances of Si—O and Si—N in the region of approximately 1000 $cm^{-1}$, a reduction in the dinitrogen monoxide flow rate leads to a relative shift in the Si—O/Si—N waiting towards the Si—N component. In other words, the proportion of nitrogen-liganded silicon increases when the dinitrogen monoxide flow rate is reduced. Stoichiometric silicon oxide occurs in the configuration $SiO_2$, and therefore a third of the silicon dioxide is made up of silicon. By contrast, the stoichiometric composition of silicon nitride is usually $Si_3N_4$, with the result that the silicon nitride component is three sevenths silicon. An increase in the nitrogen-liganded silicon component in the FTIR spectrum combined, at the same time, with a decrease in the oxygen-liganded silicon component therefore leads to an increase in the silicon content in the silicon oxynitride layer, with the result that silicon-richer layers are obtained if the flow rate of dinitrogen monoxide is reduced. Therefore, the relative dielectric constant ε of the silicon oxynitride layer which results can be increased by reducing the flow rate of dinitrogen monoxide (i.e. by selecting the flow rate ratios in accordance with the invention).

Figure 4:
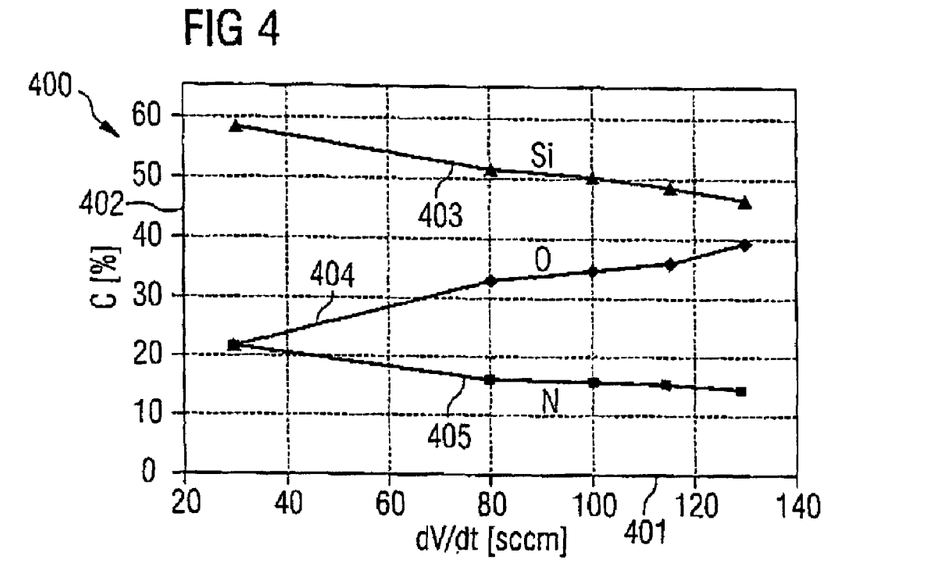
FIG. 4 shows a diagram which illustrates results of Rutherford backscattering experiments (RBS) and which also shows the way in which the concentration of silicon, oxygen and nitrogen in silicon oxynitride layers which have been produced in accordance with the invention is dependent on the flow rate of dinitrogen monoxide.

FIG. 4 shows a diagram 400 which is based on RBS (Rayleigh Backstroscopy Spectroscopy) tests carried out on silicon oxynitride layers which have been produced in accordance with the invention. In the RBS method, the composition of a layer is determined by scattering energy-rich ions at a solid body as a result of the electrostatic potential of the atomic nuclei. The quantitative composition of a layer investigated can be determined from the scattering spectrum.

In the diagram 400 shown in FIG. 4, various dinitrogen monoxide flow rates in sccm (standard cubic centimetres per minute) during production of silicon oxynitride layers according to the invention are plotted on the abscissa 401. The proportions of the elements silicon (Si), oxygen (O) and nitrogen (N) determined from the RBS spectrum are plotted on the ordinate 402. Different dinitrogen monoxide flow rates but a constant silane flow rate were used to produce the associated silicon oxynitride layers. A first curve 403 shows the way in which the amount of silicon in the silicon oxynitride layer is dependent on the different dinitrogen monoxide flow rates. A second curve 404 shows the way in which the amount of oxygen in the silicon oxynitride layers produced is dependent on these flow rates. A third curve 405 shows the amount of the nitrogen component in the silicon oxynitride layers. As can be seen from FIG. 4, there is a correlation between the amount of silicon in a silicon oxynitride layer produced in this manner and the dinitrogen monoxide flow rates used for the PECVD process. The lower the dinitrogen monoxide flow rate is selected to be, the higher the relative silicon content becomes. Therefore, the relative dielectric constant of the silicon oxynitride layer which results can be increased by reducing the dinitrogen monoxide flow rate.

Figure 5A:
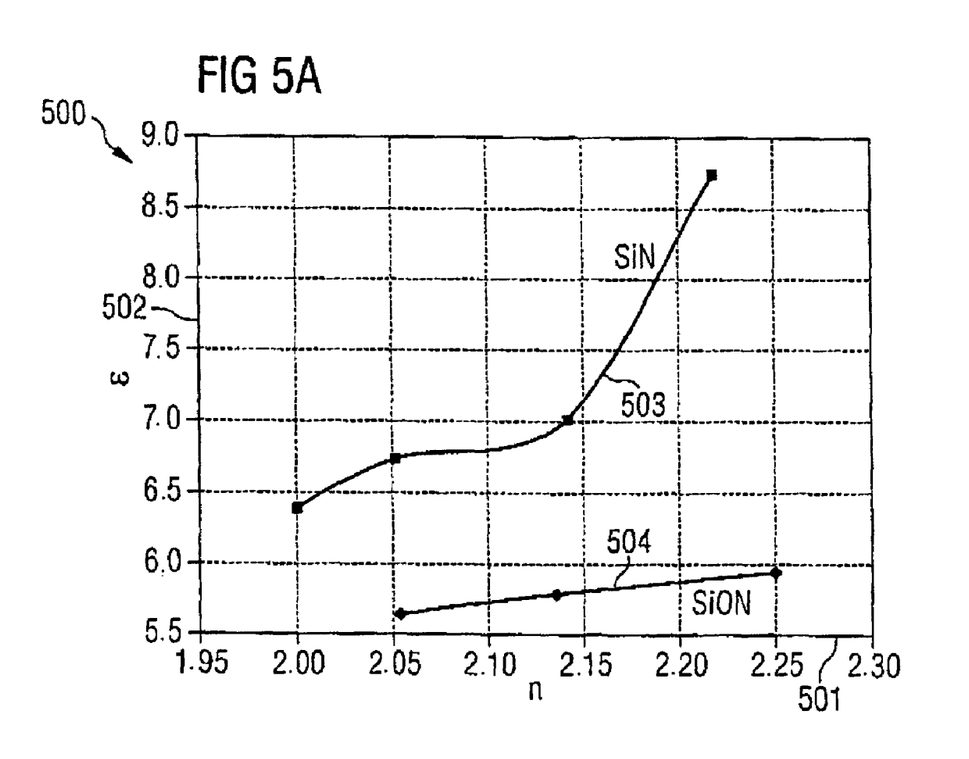
FIG. 5A shows a diagram which diagrammatically depicts the way in which the relative dielectric constant $\epsilon$ is dependent on the refractive index n for a silicon nitride layer which has been produced in accordance with the invention and for a silicon oxynitride layer which has been produced in accordance with the invention.

FIG. 5A shows a diagram 500 which shows the way in which the relative dielectric constant $\epsilon$ (dimensionless) of a silicon nitride or silicon oxynitride layer which has been produced in accordance with the invention is dependent on the refractive index n (dimensionless) of the layer for light at a wavelength of 635 nm. The refractive index n is plotted on the abscissa 501. Values for the relative dielectric constant $\epsilon$ of the silicon nitride or silicon oxynitride layers are plotted on the ordinate 502.

As can be seen from FIG. 5A, the dependent relationships for silicon nitride (first curve 503) and silicon oxynitride (second curve 504) in each case rise monotonously. In other words, an increase in the refractive index n leads to an increase in the relative dielectric constant $\epsilon$.

Figure 5B:
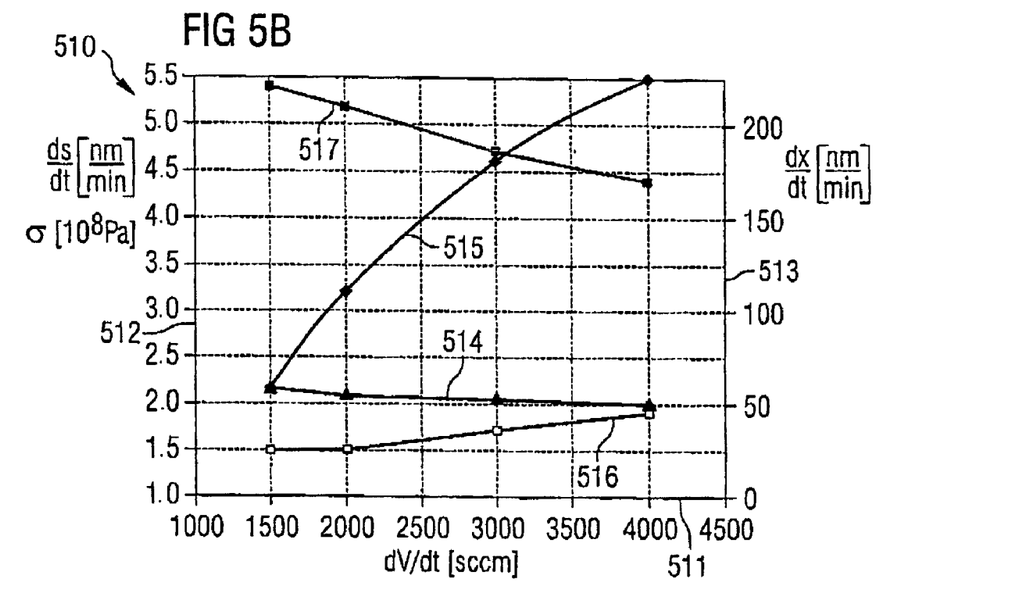
FIG. 5B shows a diagram which diagrammatically depicts the way in which various physical parameters of a silicon nitride layer which has been produced in accordance with the invention are dependent on the ammonia flow rate.

Referring to the diagram 510 shown in FIG. 5B, the text which follows explains the way in which a range of physical parameters of a silicon nitride layer which has been produced are dependent on the ammonia flow rate dV/dt (in sccm) during the PECVD process according to the invention. Various flow rates of ammonia in standard cubic centimetres per minute are plotted on the abscissa 511. The refractive index n (dimensionless), the wet-etching rate ds/dt (in nm per minute) and the compressive stress $\sigma$ of the silicon nitride layer (in $10^8$ Pa) are plotted on a first ordinate 512. The deposition rate dx/dt (in nm per minute) is plotted on the second ordinate 513 of the diagram 510.

A first curve 514 shows the way in which the refractive index n of the silicon nitride layer which has been produced in accordance with the invention is dependent on the ammonia flow rate which is set. As shown in FIG. 5B, there is an unambiguous correlation between a reduction in the ammonia flow rate dV/dt and an increase in the refractive index n. Referring back to FIG. 5A, an increased refractive index of a silicon nitride layer (cf. first curve 503) corresponds to an increase in the relative dielectric constant of the layer. If the conclusions drawn from diagram 510 and diagram 500 are combined, it can be determined that a reduction in the ammonia flow rate leads to an increase in the relative dielectric constant. This is a significant effect on which the invention is based.

Furthermore, FIG. 5B shows a second curve 515, which shows the way in which the wet-etching rate ds/dt (in nm per minute) is dependent on the ammonia flow rate dV/dt. Therefore, a reduced ammonia flow rate not only leads to an increase in the relative dielectric constant but also leads to a significant drop in the wet-etching rate. A sufficiently low wet-etching rate ensures that defined etching back of a layer which has been produced in accordance with the invention is made possible. Since at a high dielectric constant the wet-etching rate of the silicon nitride layer produced in accordance with the invention is reduced, it becomes possible to process a layer of this type further under defined conditions.

Furthermore, the diagram 510 shows a third curve 516, which shows the way in which the compressive stress $\sigma$ (in $10^8$ Pa) is dependent on the ammonia flow rate. Therefore, an increase in the relative dielectric constant as a result of the reduction in the ammonia flow rate is associated with a drop in the compressive stress and consequently a reduced internal stress in the silicon nitride layer, which is advantageous.

Furthermore, the diagram 510 shows a fourth curve 517, which shows the way in which the silicon nitride deposition rate is dependent on the ammonia flow rate. The lower the ammonia flow rate is selected to be, the higher the deposition rate becomes.

Figure 5C:
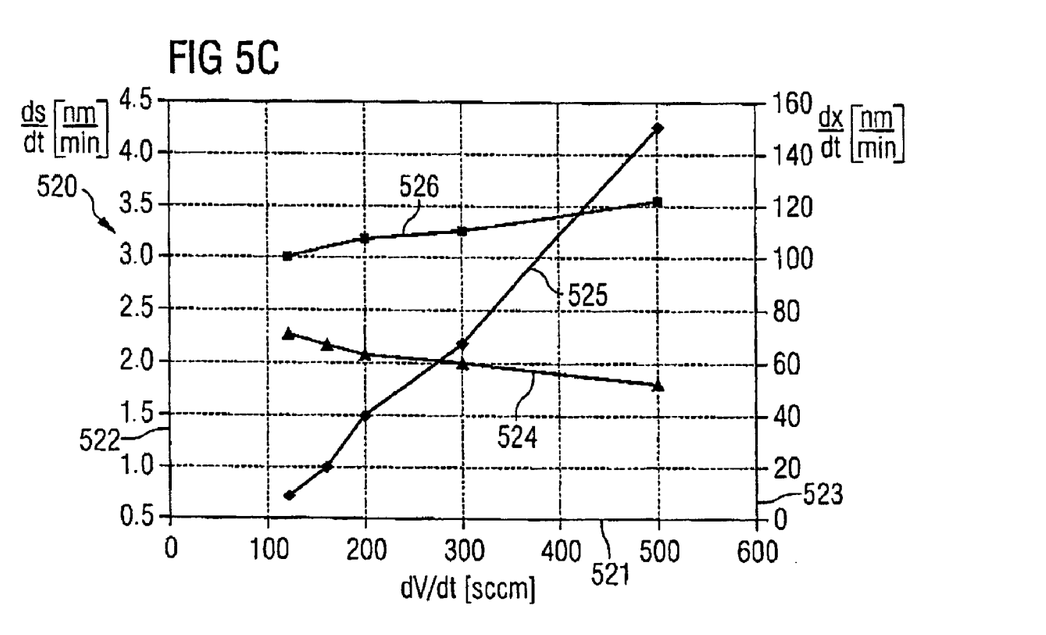
FIG. 5C shows a diagram which diagrammatically depicts the way in which various physical parameters of a silicon oxynitride layer which has been produced in accordance with the invention are dependent on the dinitrogen monoxide flow rate.

The following text, referring to FIG. 5C, provides an explanation of the diagram 520 shown in that figure, which, for silicon oxynitride layers which have been produced in accordance with the invention, shows the way in which various physical parameters are dependent on the dinitrogen monoxide flow rate (in sccm).

The flow rate of dinitrogen monoxide in the PECVD process according to the invention is plotted on the abscissa 511. Furthermore, the refractive index n (dimensionless) is plotted on a first ordinate 522, and so is the wet-etching rate ds/dt (in nm per minute). The deposition rate of silicon oxynitride as obtained using the process according to the invention is plotted on a second ordinate 523.

A first curve 524 in the diagram 520 shows the way in which the refractive index n is dependent on the dinitrogen monoxide flow rate. The correlation whereby a reduction in the dinitrogen monoxide flow rate leads to an increase in the relative dielectric constant $\epsilon$ can be seen from the first curve 524 from FIG. 5C and from the second curve 504 from FIG. 5A.

A curve 525 from FIG. 5C shows the way in which the wet-etching rate ds/dt is dependent on the flow rate of dinitrogen monoxide during the PECVD process. In the case of silicon oxynitride too, a reduction in the flow rate (in this case of dinitrogen monoxide) leads to a reduction in the wet-etching rate, and consequently reducing the dinitrogen monoxide flow rate allows further processing of the silicon oxynitride layer which has been produced in accordance with the invention under defined process conditions.

Furthermore, diagram 520 shows a third curve 526, which shows the way in which the silicon oxynitride deposition rate is dependent on the dinitrogen monoxide flow rate. Unlike in the case of the silicon nitride layer (cf. curve 517 from diagram 510), in the case of silicon oxynitride a reduction in the flow rate (in this case of dinitrogen monoxide) leads to a reduction in the deposition rate 526.

The described physical parameters of the silicon nitride and silicon oxynitride layers which have been produced in accordance with the invention and the way in which the physical parameters of these layers are dependent on the process conditions shows that layers with an increased $\epsilon$ and advantageous material properties are obtained by reducing the flow rates of ammonia and of dinitrogen monoxide during a PECVD process.

In particular, layers of this type have the required electrical, mechanical and optical properties making them suitable for use as dielectric layers of an MIM capacitor.

The following publications are cited in this document:

[1] U.S. Pat. No. 6,383,874 B1
[2] U.S. Pat. No. 4,618,541
[3] U.S. Pat. No. 6,316 820 B1
[4] U.S. Pat. No. 6,372,688 B2
[5] U.S. Pat. No. 6,309,932 B1
[6] U.S. Pat. No. 5,466,617
[7] U.S. Pat. No. 5,164,339
[8] U.S. Pat. No. 6,383,874 B1
[9] U.S. Pat. No. 6,324,439 B1
[10] EP 0,454,100 A2

The invention claimed is:

1. A method for producing a metal-insulator-metal (MIM) capacitor, the method comprising:
   forming a first electrically conductive capacitor layer of the MIM capacitor on a substrate;
   forming a silicon nitride capacitor insulator layer of the MIM capacitor on the first electrically conductive layer using a plasma-enhanced chemical vapor deposition process in a process chamber, in which silane, ammonia and nitrogen are used as precursors, a silane-to-ammonia flow rate ratio is between 1:20 and 6:5, a silane-to-nitrogen flow rate ratio is between 1:40 and 3:5, and a pressure in the process chamber is between 260 Pa and 530 Pa so that a desired, predeterminable stoichiometry with an increased silicon content is obtained in the silicon nitride layer thereby increasing the dielectric constant of the silicon nitride layer; and
   forming a second electrically conductive capacitor layer of the MIM capacitor on the silicon nitride layer.

2. The method according to claim 1, further comprising generating a plasma in the process chamber using a high-frequency field with a power of between 300 W and 700 W.

3. The method according to claim 2, further comprising accumulating the plasma in an area surrounding the substrate using a low-frequency field with a power of between 300 W and 700 W.

4. The method according to claim 3, wherein the silane-to-ammonia flow rate ratio is between 1:10 and 3:5, the silane-to-nitrogen flow rate ratio is between 1:20 and 3:10, the pressure in the process chamber is between 360 Pa and 430 Pa, the power of the high-frequency field and the power of the low-frequency field are each, independently of one another, between 400 W and 600 W.

5. The method according to claim 3, wherein the silane-to-ammonia flow rate ratio is approximately 3:10, the silane-to-nitrogen flow rate ratio is approximately 3:16, the pressure in the process chamber is approximately 350 Pa, and the high-frequency power and the low-frequency power are each approximately 500 W.

6. The method according to claim 5, wherein a flow rate of silane is approximately 300 sccm.

7. The method according to claim 1, wherein a flow rate of silane is between 100 and 600 sccm.

8. The method according to claim 1, wherein the substrate is a semiconductor substrate.

9. The method according to claim 8, wherein the substrate is a silicon substrate.

10. A method for producing a metal-insulator-metal (MIM) capacitor, the method comprising:
    forming a first electrically conductive capacitor layer of the MIM capacitor on a substrate;
    forming a silicon oxynitride capacitor insulator layer of the MIM capacitor on the first electrically conductive layer using a plasma-enhanced chemical vapor deposition process in a process chamber, in which silane, dinitrogen monoxide and nitrogen are used as precursors, a silane-to-dinitrogen monoxide flow rate ratio is between 1:2 and 25:4, a silane-to-nitrogen flow rate ratio is between 1:100 and 1:10 so that a desired, predeterminable stoichiometry with an increased silicon content is obtained in the silicon oxynitride layer thereby increasing the dielectric constant of the silicon oxynitride layer; and
    forming a second electrically conductive capacitor layer of the MIM capacitor on the silicon nitride layer.

11. The method according to claim 10, wherein a pressure in the process chamber is between 260 Pa and 530 Pa.

12. The method according to claim 10, further comprising generating a plasma using a high-frequency field with a power of between 200 W and 500 W.

13. The method according to claim 12, further comprising accumulating the plasma in an area surrounding the substrate using a low-frequency field with a power of up to 300 W.

14. The method according to claim 13, wherein the silane-to-dinitrogen monoxide flow rate ratio is between 1:1 and 25:8, the silane-to-nitrogen flow rate ratio is between 1:50 and 1:20, a pressure in the process chamber is between 350 Pa and 430 Pa, the power of the high-frequency field is between 300 W and 400 W and the power of the low-frequency field is up to 150 W.

15. The method according to claim 14, wherein the silane-to-dinitrogen monoxide flow rate ratio is approximately 13:12, the silane-to-nitrogen flow rate ratio is approximately 13:800, the pressure in the process chamber is approximately 350 Pa, and the power to the high-frequency field is approximately 300 W.

16. The method according to claim 15, wherein a flow rate of silane is approximately 130 sccm.

17. The method according to claim 10, wherein a flow rate of silane is between 100 and 500 sccm.

18. The method according to claim 10, wherein the substrate is a semiconductor substrate.

19. The method according to claim 18, wherein the substrate is a silicon substrate.

20. A set of layers comprising a metal-insulator-metal (MIM) capacitor on a substrate, the layers comprising:
    a first electrically conductive capacitor layer;
    a silicon nitride capacitor insulator layer on the first electrically conductive layer, the silicon nitride layer formed using a plasma-enhanced chemical vapor deposition process in a process chamber, in which silane, ammonia and nitrogen are used as precursors, a silane-to-ammonia flow rate ratio is between 1:20 and 6:5, a silane-to-nitrogen flow rate ratio is between 1:40 and 3:5, and a pressure in the process chamber is between 260 Pa and 530 Pa so that a desired, predeterminable stoichiometry with an increased silicon content is obtained in the silicon nitride layer thereby increasing the dielectric constant of the silicon nitride layer; and a second electrically conductive capacitor layer on the silicon nitride layer.

21. A set of layers on a substrate, the layers comprising:

a first electrically conductive capacitor layer;

a silicon oxynitride capacitor insulator layer formed on the first electrically conductive layer using a plasma-enhanced chemical vapor deposition process in a process chamber, in which silane, dinitrogen monoxide and nitrogen are used as precursors, a silane-to-dinitrogen monoxide flow rate ratio is between 1:2 and 25:4, a silane-to-nitrogen flow rate ratio is between 1:100 and 1:10 so that a desired, predeterminable stoichiometry with an increased silicon content is obtained in the silicon oxynitride layer thereby increasing the dielectric constant of the silicon oxynitride layer; and a second electrically conductive capacitor layer on the silicon nitride layer.

* * * * *